(12) United States Patent
Yeh et al.

(10) Patent No.: US 8,169,761 B2
(45) Date of Patent: May 1, 2012

(54) ESD CLAMP CIRCUIT APPLIED TO POWER AMPLIFIER

(75) Inventors: Chih-Ting Yeh, Hsinchu County (TW); Yung-Chih Liang, Taipei County (TW); Shih-Hung Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 462 days.

(21) Appl. No.: 12/400,799

(22) Filed: Mar. 10, 2009

(65) Prior Publication Data

US 2010/0149703 A1 Jun. 17, 2010

(30) Foreign Application Priority Data

Dec. 11, 2008 (TW) ................................ 97148269 A

(51) Int. Cl.
*H02H 9/00* (2006.01)
(52) U.S. Cl. ........................ 361/56; 361/91.1; 361/111
(58) Field of Classification Search .................. None
See application file for complete search history.

(56) References Cited

U.S. PATENT DOCUMENTS

| | | | | |
|---|---|---|---|---|
| 6,249,410 B1 * | 6/2001 | Ker et al. | ...................... | 361/56 |
| 6,690,561 B2 * | 2/2004 | Hung et al. | ................... | 361/111 |
| 7,027,276 B2 * | 4/2006 | Chen | .............................. | 361/56 |
| 7,061,737 B2 * | 6/2006 | Chen | ........................... | 361/91.1 |
| 7,626,790 B2 * | 12/2009 | Hung | ............................. | 361/56 |

* cited by examiner

*Primary Examiner* — Jared Fureman
*Assistant Examiner* — Terrence Willoughby
(74) *Attorney, Agent, or Firm* — Jianq Chyun IP Office

(57) ABSTRACT

An ESD clamp circuit applied to a power amplifier is provided. The ESD clamp circuit includes a first line, a second line, a first circuit, a second circuit, an ESD detecting unit, a buffer unit, and an ESD clamp unit. The first line is coupled to the output terminal of the power amplifier. The first circuit is coupled to the first line. The second circuit is coupled to the first circuit. The ESD detecting unit is coupled to the first circuit and the second line. The buffer unit is coupled to the second circuit, the second line and the ESD detecting unit. The ESD clamp unit is coupled to the buffer unit, the first line and the second line. Therefore, at normal operation mode, the problem of signal loss caused by the leakage current of ESD clamp circuit can be avoided.

32 Claims, 11 Drawing Sheets

ESD CLAMP CIRCUIT APPLIED TO POWER AMPLIFIER

CROSS-REFERENCE TO RELATED APPLICATION

This application claims the priority benefit of Taiwan application serial no. 97148269, filed on Dec. 11, 2008. The entirety of the above-mentioned patent application is hereby incorporated by reference herein and made a part of this specification.

BACKGROUND OF THE INVENTION

1. Field of the Invention

The present invention generally relates to an ESD clamp circuit, and more particularly, to an ESD clamp circuit that can avoid the problem of signal loss caused by the leakage current.

2. Description of Related Art

Nowadays, the manufacture process technology of complementary metal-oxide semiconductor (CMOS) device is developed to nano-meter scale. In order to combine with other CMOS circuit to achieve a design of system-on-a-chip (SOC), a radio frequency (RF) circuit designed by the manufacture process of SiGe would be substituted by the manufacture process of CMOS. In order to discharge ESD current effectively, ESD protection elements are placed at an input/output (I/O) ports and between power-rails to protect the core circuits from damage.

In order to output high power in the MOS power amplifier design, NMOS with big size served as output stage device is required. Moreover, considering the current density, the inductor placed between VDD power line and the drain of the big size NMOS would occupy a large IC layout area. Therefore, to integrate this large inductor into the same IC is inadvisable. For this reason, the inductor may be disposed off chip, and the rest of the principal power amplifier circuit is designed on the same chip, shown as FIG. 1.

FIG. 1 is a schematic diagram illustrating a conventional power amplifier. Referring to FIG. 1, to achieve ESD protection of the IC completely, a power-rail ESD clamp circuit 110 have to disposed between a output terminal Vout1 of the power amplifier 100 and a ground voltage VSS to discharge ESD current, so as to prevent inner elements damaged. In addition, if design of conventional power-rail ESD protection is used at normal operation, a problem of signal loss is generated by the power amplifier 100 caused by the leakage current of power-rail ESD clamp circuit 110.

FIG. 2 is a schematic diagram illustrating the power amplifier of FIG. 1 and an additional ESD protection circuit thereof. Referring to FIG. 2, while a power amplifier 200 operates in normal, an output terminal of the power amplifier 200 has a voltage signal, which has a high frequency and a voltage level higher than a power VDD. The frequency of the voltage signal is so high that the frequency of a voltage signal at node A between a resistor and a capacitor of an ESD clamp circuit 210 can not follow the frequency of the voltage signal. Therefore, the voltage level at node A is still equal to the voltage level the power VDD, and oscillates with the voltage signal with small amplitude. A transistor M2 in an inverter which composed of the transistor M2 and a transistor M3 turns on to charge the gate terminal of a transistor M1 according to a voltage difference between the voltage level at node A and the voltage signal having a high frequency and a voltage level at node B. Therefore, a voltage at node C is higher than a threshold voltage of the transistor M1, so that the transistor M1 is turned on to form a leakage path under the power amplifier 200 operates in normal. An output signal of the power amplifier 200 has distortion caused by the leakage current flowing through the leakage path.

FIG. 3 is a schematic diagram of illustrating a voltage wave of ESD clamp circuit of FIG. 2. Referring to FIG. 3, a curve 301 is a voltage wave at node B of FIG. 2, a curve 302 is a voltage wave at node A of FIG. 2, a curve 303 is a voltage wave at node C of FIG. 2, and a dotted line 304 is the threshold voltage of the transistor M1. Referring to the curve 303 and the dotted line 304, while the voltage at node C is higher than the threshold voltage of the transistor M1, so that the transistor M1 is turned on to form a leakage path under the power amplifier 200 operates in normal. An output signal of the power amplifier 200 has distortion caused by the leakage current flowing through the leakage path.

FIG. 4 is another schematic diagram illustrating the power amplifier of FIG. 1 and an additional ESD protection circuit thereof. Referring to FIG. 4, a signal outputted from the output terminal Vout3 of a power amplifier 400 is coupled to node D through a capacitor. While an output voltage of the amplifier 400 is so high that voltage at node D is higher than threshold voltage of the transistor M4, and the transistor M4 is turned on to form a leakage path. The output signal of the power amplifier 400 has distortion caused by the leakage current flowing through the leakage path.

FIG. 5 is a schematic diagram illustrating a voltage wave of ESD clamp circuit of FIG. 4. Referring to FIG. 5, a curve 501 is a voltage wave at node E of FIG. 4, a curve 502 is a voltage wave at node D of FIG. 4, and a dotted line 503 is the threshold voltage of the transistor M4. Referring to the curve 502 and the dotted line 503, while the voltage at node D is higher than the threshold voltage of the transistor M4, so that the transistor M4 is turned on to form a leakage path. An output signal of the power amplifier 400 has distortion caused by the leakage current flowing through the leakage path.

FIG. 6 is a schematic diagram illustrating a radio frequency power amplifier circuit of U.S. Pat. No. 7,280,330. Referring to FIG. 6, in an ESD clamp circuit, a capacitor resistor (CR) structure is serving as an ESD detection circuit. While an ESD event occurred, a diode D1 is biased with a part of voltage between PAout and VSS, which is an ESD path, and thus transistors 620 and 630 are turned on due to high voltage of the ESD, which is coupled to the gates of transistors 620 and 630 through a transistor-based capacitor 610. While the ESD passes from VSS to PAOUT, the diode D2 between PAOUT and VSS in the ESD clamp circuit is forward turned on to discharge an ESD current. While a radio frequency power amplifier operates in normal mode, the diode D1 achieves a clamp function, so that a voltage signal outputted from PAOUT decayed by the diode D1 is not enough to turn on an output ESD cell 650. Thereby, in the normal mode, the output ESD cell 650 may not influence normal work of the circuit.

SUMMARY OF THE INVENTION

The present invention provides an ESD clamp circuit, applied to a power amplifier, wherein the ESD clamp circuit includes a first line, a second line, a first circuit, a second circuit, an ESD detecting unit, a buffer unit, and an ESD clamp unit. The first line is coupled to an output terminal of the power amplifier. The first circuit has a first terminal and a second terminal. The first terminal of the first circuit is coupled to the first line. The second circuit has a first terminal and a second terminal. The first terminal of the second circuit is coupled to the second terminal of the first circuit. The ESD detecting unit has a first detection terminal, a second detection terminal, and an output terminal. The first detection terminal of the ESD detecting unit is coupled to the second terminal of the first circuit. The second detection terminal of the ESD detecting unit is coupled to the second line. The buffer unit has a first power terminal, a second power terminal, an input terminal, and an output terminal. The first power terminal of the buffer unit is coupled to the second terminal of the second circuit. The second power terminal of the buffer unit is coupled to the second line. The input terminal of the buffer unit is coupled to the output terminal of the ESD detecting unit. The ESD clamp unit has a control terminal, a first terminal, and a second terminal. The control terminal of the ESD clamp unit is coupled to the output terminal of the buffer unit. The first terminal of the ESD clamp unit is coupled to the first line. The second terminal of the ESD clamp unit is coupled to the second line.

In the present invention, a first circuit is added between a first line and an ESD detecting unit, and/or a second circuit is added between the first circuit and a buffer unit. Therefore, an ESD clamp unit is turned off effectively, so signal loss caused by the leakage current of ESD clamp circuit can be avoided in a power amplifier.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
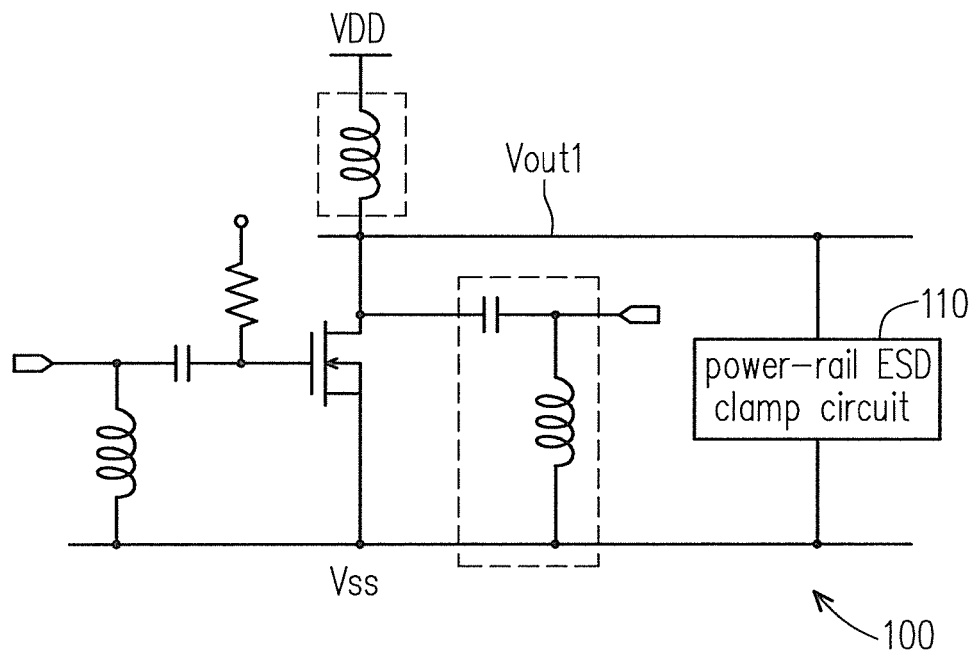
FIG. 1 is a schematic diagram illustrating a conventional power amplifier.

Reference will now be made in detail to the present embodiments of the invention, examples of which are illustrated in the accompanying drawings. Wherever possible, the same reference numbers are used in the drawings and the description to refer to the same or like parts.

Figure 7:
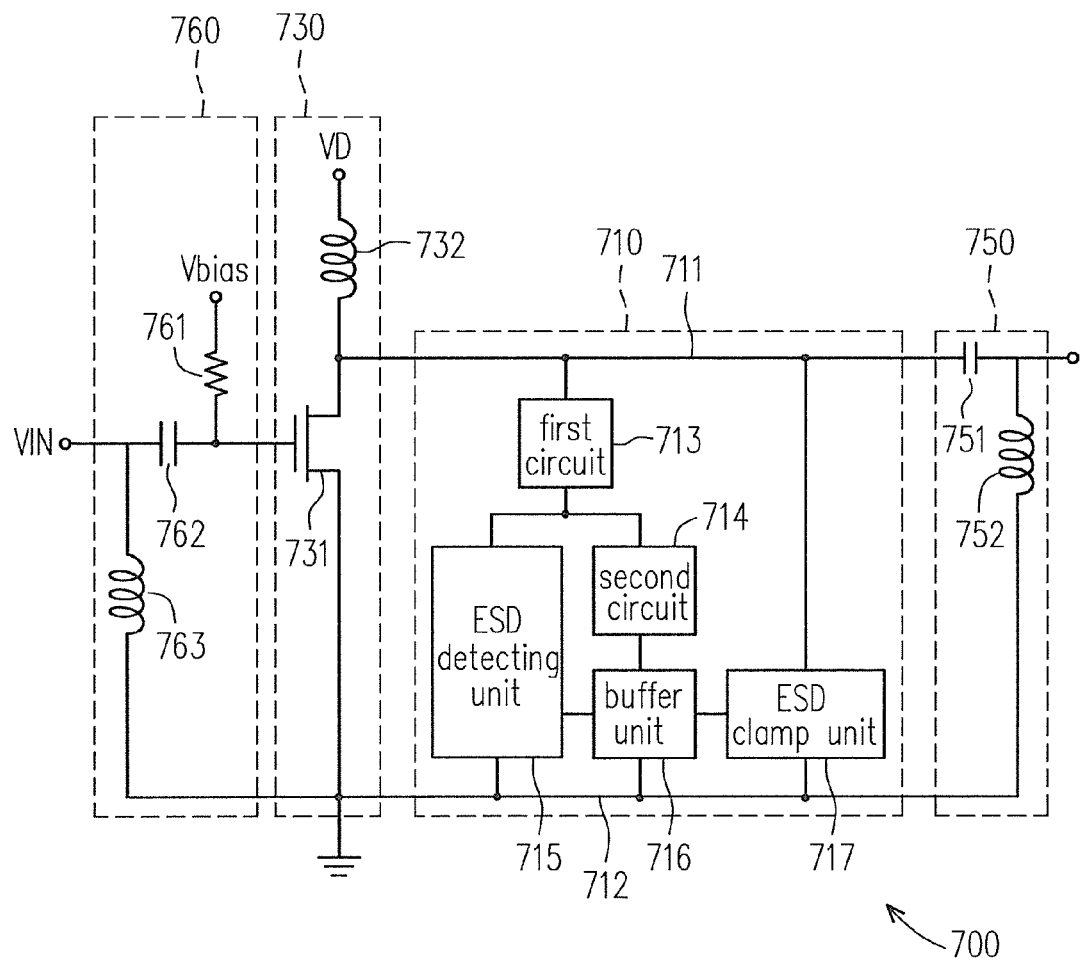
FIG. 7 is a schematic diagram of a power amplifier device according to an embodiment of the present invention.

FIG. 7 is a schematic diagram of a power amplifier device according to an embodiment of the present invention. Referring to FIG. 7, the power amplifier device 700 includes an ESD clamp circuit 710, a power amplifier 730, a matching network 750 and 760. the ESD clamp circuit 710 includes a first line 711, a second line 712, a first circuit 713, a second circuit 714, an ESD detecting unit 715, a buffer unit 716, and an ESD clamp unit 717.

The first circuit 713 has a first terminal and a second terminal. The first terminal of the first circuit 713 is coupled to the first line 711. The second circuit 714 has a first terminal and a second terminal. The first terminal of the second circuit 714 is coupled to the second terminal of the first circuit 713. The ESD detecting unit 715 has a first detection terminal, a second detection terminal, and an output terminal. The first detection terminal of the ESD detecting unit 715 is coupled to the second terminal of the first circuit 713. The second detection terminal of the ESD detecting unit 715 is coupled to the second line 712.

The buffer unit 716 has a first power terminal, a second power terminal, an input terminal, and an output terminal. The first power terminal of the buffer unit 716 is coupled to the second terminal of the second circuit 714. The second power terminal of the buffer unit 716 is coupled to the second line 712. The input terminal of the buffer unit 716 is coupled to the output terminal of the ESD detecting unit 715. The ESD clamp unit 717 has a control terminal, a first terminal, and a second terminal. The control terminal of the ESD clamp unit 717 is coupled to the output terminal of the buffer unit 716. The first terminal of the ESD clamp unit 717 is coupled to the first line 711. The second terminal of the ESD clamp unit 717 is coupled to the second line 712.

The power amplifier 730 includes an N-channel transistor 731 and a radio frequency choke 732. A gate terminal of the N-channel transistor 731 receives an input voltage VIN. A source terminal of the N-channel transistor 731 is coupled to the second line 712. A drain terminal of the N-channel transistor 731 is coupled to an output terminal of the power amplifier 730. A first terminal of the radio frequency choke 732 is coupled to the drain terminal of the N-channel transistor 731. A second terminal of the radio frequency choke 732 receives a power voltage VD. In the present embodiment, the radio frequency choke 732 is disposed off-chip, but the principal structure of the power amplifier 730 is disposed on the same chip.

A matching circuit 750 is coupled to the first line 711, for matching an output impedance of the power amplifier 730. In the present embodiment, the matching circuit 750 includes a capacitor 751 and an inductor 752. A first terminal of the capacitor 751 is coupled to the first line 711. A second terminal of the capacitor 751 serves as an output terminal of the power amplifier device 700. A first terminal of the inductor 752 is coupled to the second terminal of the capacitor 751. A second terminal of the inductor 752 is coupled to the second line 712.

A matching unit 760 is coupled between the input voltage VIN and the gate terminal of the N-channel transistor, for matching an input impedance of the power amplifier 730. In the present embodiment, the matching unit 760 includes a resistor 761, a capacitor 762 and an inductor 763. A first terminal of the resistor 761 receives a bias Vbias. A second terminal of the resistor 761 is coupled to the gate terminal of the power amplifier 730. A first terminal of the capacitor 762 is coupled to the second terminal of the resistor 761. A second terminal of the capacitor 762 receives the input voltage VIN. A first terminal of the inductor 763 is coupled to the second terminal of the capacitor 762. A second terminal of the inductor 763 is coupled to the second line 712.

According to a whole operation, while the power amplifier device 700 operates in normal, the first circuit 713 and the second circuit 714 in the ESD clamp circuit 710 are utilized to turn off the ESD clamp unit 717, so that a leakage current path may not be generated. Thereby, the problem of signal loss caused by the leakage current of ESD clamp circuit turned on can be avoided in the power amplifier 700.

An implementation of the ESD clamp circuit 710 will be described below so that the problem of signal loss caused by the leakage current can be avoided. First, in the present embodiment, it is assume that an operation voltage of the second line 712 is lower than a voltage of the first line 711, and the operation voltage of the second line 712 is a ground voltage.

Figure 8A:
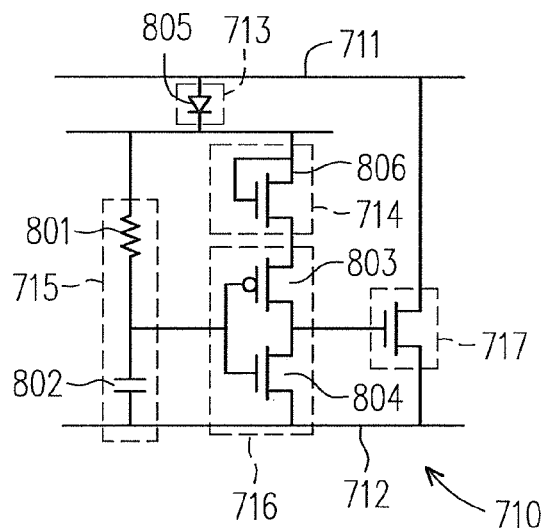
FIG. 8A is a schematic diagram of the ESD clamp circuit according to an embodiment of the present invention.

FIG. 8A is a schematic diagram of the ESD clamp circuit according to an embodiment of the present invention. Referring to FIG. 8A, the ESD clamp unit 717 is, for example, an N-channel transistor. Namely, a gate terminal of the N-channel transistor is the control terminal of the ESD clamp unit 717. A drain terminal of the N-channel transistor is the first terminal of the ESD clamp unit 717. A source terminal of the N-channel transistor is the second terminal of the ESD clamp unit 717. In addition, the ESD clamp unit 717 in the above embodiment is an N-channel transistor, and the present invention is not limited thereto. For instance, the ESD clamp unit 717 may be an element having a switch function.

The ESD detecting unit 715 includes a resistor 801 and a capacitor 802. A first terminal of the resistor 801 serves as the first detection terminal of the ESD detecting unit 715. A second terminal of the resistor 801 serves as the output terminal of the ESD detecting unit 715. A first terminal of the capacitor 802 is coupled to the second terminal of the resistor 801. A second terminal of the capacitor 802 serves as the second detection terminal of the ESD detecting unit 715.

Further, the buffer unit 716 includes a P-channel transistor 803 and N-channel transistor 804. An inverter is composed of the electrically connected P-channel transistor 803 and the N-channel transistor 804. A gate terminal of the P-channel transistor 803 serves as the input terminal of the buffer unit 716. A source terminal of the P-channel transistor 803 serves as the first power terminal of the buffer unit 716. A drain terminal of the P-channel transistor 803 serves as the output terminal of the buffer unit 716. A gate terminal of the N-channel transistor 804 is coupled to the gate terminal of the P-channel transistor 803. A source terminal of the N-channel transistor 804 serves as the second power terminal of the buffer unit 716. A drain terminal of the N-channel transistor 804 is coupled to the drain terminal of the P-channel transistor 803.

The first circuit 713 is, for example, a diode 805. An anode of the diode 805 serves the first terminal of the first circuit 713. A cathode of the diode 805 serves as the second terminal of the first circuit 713. The second circuit 714 is, for example, an N-channel transistor 806. A drain terminal of the N-channel transistor 806 serves as the first terminal of the second circuit 714. The gate terminal of the N-channel transistor 806 is coupled to the drain terminal of the N-channel transistor 806. The source terminal of the N-channel transistor 806 serves as the second terminal of the second circuit 714.

According to the whole operation, while the power amplifier device 700 operates in high frequency, a node voltage between the resistor 801 and the capacitor 802 oscillates in high frequency as an output signal generated by the power amplifier 730 because the first circuit 713 is disposed between the ESD detecting unit 715 and the first line 711, and the resistor 801 and the capacitor 802 in the ESD detecting unit 715 have a RC time constant. Besides, a voltage at source terminal of the P-channel transistor 803 in the buffer unit 716 may not oscillate with large amplitude as the output signal having high frequency. Therefore, the voltage between the gate terminal and the source terminal of the P-channel transistor 803 is still lower than a threshold voltage of the P-channel transistor 803, so that an N-channel transistor in the ESD clamp unit 717 may not be turned on. Thereby, the problem of signal loss caused by the leakage current can be avoided in the ESD clamp circuit 710. In addition, while the ESD occurs, an ESD current is still discharged by the ESD clamp unit 717.

Figure 8B:
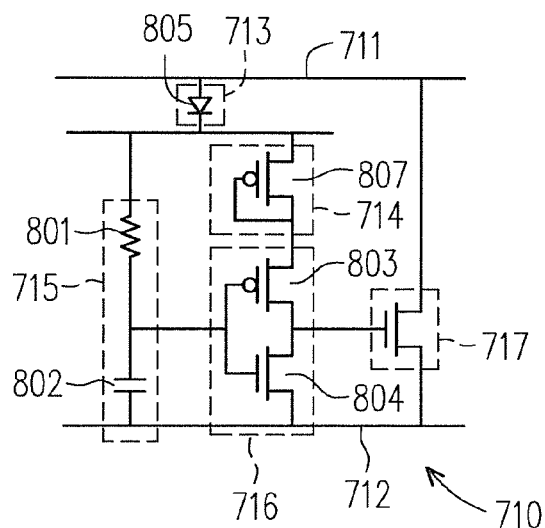
FIG. 8B is a schematic diagram of the ESD clamp circuit according to an embodiment of the present invention.

FIG. 8B is a schematic diagram of the ESD clamp circuit 710 according to an embodiment of the present invention. The difference between FIG. 8A and FIG. 8B is that the second circuit 714 in the ESD clamp circuit 710 in FIG. 8B is, for example, a P-channel transistor 807. A source terminal of the P-channel transistor 807 serves the first terminal of the second circuit 714. A drain terminal of the P-channel transistor 807 serves the second terminal of the second circuit 714. A gate terminal of the P-channel transistor 807 is coupled to the drain terminal of the P-channel transistor 807. In the present embodiment, an operation method of the ESD clamp circuit 710 is similar to the description of FIG. 8A, the detail is not iterated.

Figure 8C:
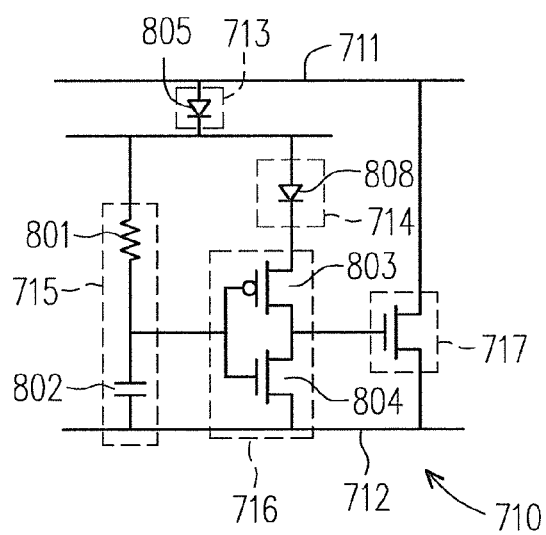
FIG. 8C is a schematic diagram of the ESD clamp circuit according to an embodiment of the present invention.

FIG. 8C is a schematic diagram of the ESD clamp circuit 710 according to an embodiment of the present invention. Referring to the FIG. 8C, the difference between FIG. 8A and FIG. 8C is that the second circuit 714 in the ESD clamp circuit 710 in FIG. 8C is, for example, a diode 808. An anode of the diode 808 serves the first terminal of the second circuit 714. A cathode of the diode 808 serves the second terminal of the second circuit 714. In the present embodiment, an operation method of the ESD clamp circuit 710 is similar to the description of FIG. 8A, the detail is not iterated.

Figure 8D:
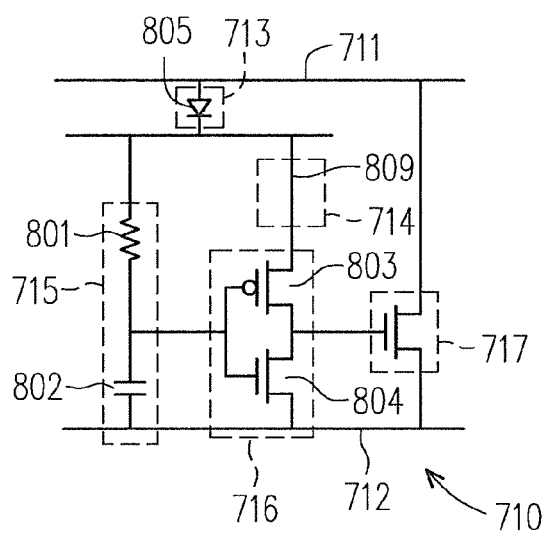
FIG. 8D is a schematic diagram of the ESD clamp circuit according to an embodiment of the present invention.

FIG. 8D is a schematic diagram of the ESD clamp circuit 710 according to an embodiment of the present invention. Referring to the FIG. 8D, the difference between FIG. 8A and FIG. 8D is that the second circuit 714 in the ESD clamp circuit 710 in FIG. 8D is, for example, a conducting wire 809. A first terminal of the conducting wire 809 serves the first terminal of the second circuit 714. A second terminal of the conducting wire 809 serves the second terminal of the second circuit 714. In the present embodiment, an operation method of the ESD clamp circuit 710 is similar to the description of FIG. 8A, the detail is not iterated.

Figure 8E:
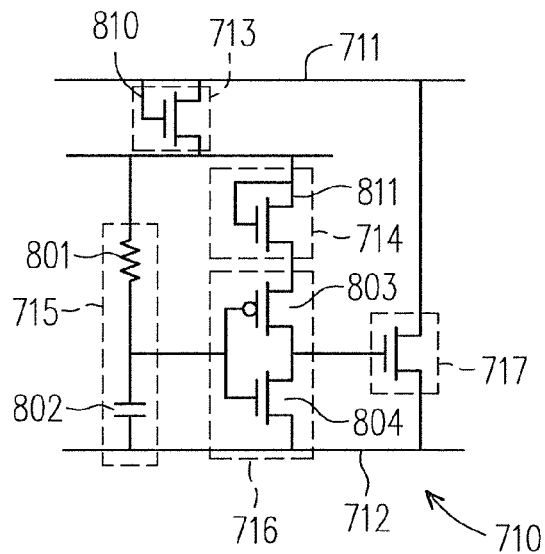
FIG. 8E is a schematic diagram of the ESD clamp circuit according to an embodiment of the present invention.

FIG. 8E is a schematic diagram of the ESD clamp circuit 710 according to an embodiment of the present invention. Referring to the FIG. 8E, the difference between FIG. 8A and FIG. 8E is that the first circuit 713 in the ESD clamp circuit 710 in FIG. 8E is, for example, an N-channel transistor 810, and the second circuit 714 in the ESD clamp circuit 710 in FIG. 8E is, for example, an N-channel transistor 811. A drain terminal of the N-channel transistor 810 serves the first terminal of the first circuit 713. A gate terminal of the N-channel transistor 810 is coupled to the drain terminal of the N-channel transistor 810. A source terminal of the N-channel transistor 810 serves the second terminal of the first circuit 713. A drain terminal of the N-channel transistor 811 serves the first terminal of the second circuit 714. A gate terminal of the N-channel transistor 811 is coupled to the drain terminal of the N-channel transistor 811. A source terminal of the N-channel transistor 811 serves the second terminal of the second circuit 714. In the present embodiment, an operation method of the ESD clamp circuit 710 is similar to the description of FIG. 8A, the detail is not iterated.

Figure 8F:
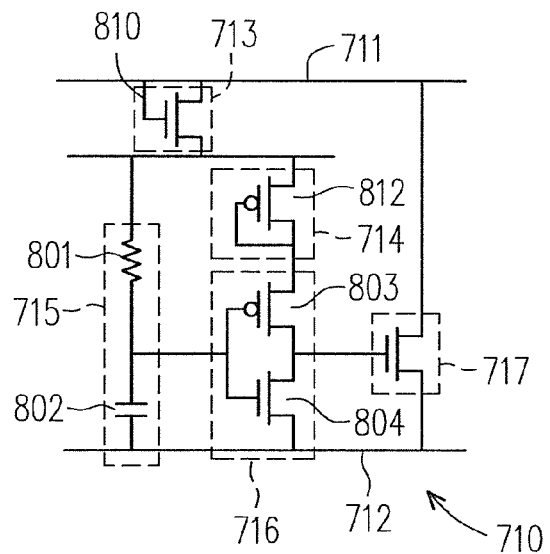
FIG. 8F is a schematic diagram of the ESD clamp circuit according to an embodiment of the present invention.

FIG. 8F is a schematic diagram of the ESD clamp circuit 710 according to an embodiment of the present invention. Referring to the FIG. 8F, the difference between FIG. 8E and FIG. 8F is that the second circuit 714 in the ESD clamp circuit 710 in FIG. 8F is, for example, a P-channel transistor 812. A source terminal of the P-channel transistor 812 serves the first terminal of the second circuit 714. A drain terminal of the P-channel transistor 812 serves the second terminal of the second circuit 714. A gate terminal of the P-channel transistor 812 is coupled to the drain terminal of the P-channel transistor 812. In the present embodiment, an operation method of the ESD clamp circuit 710 is similar to the description of FIG. 8A, the detail is not iterated.

Figure 8G:
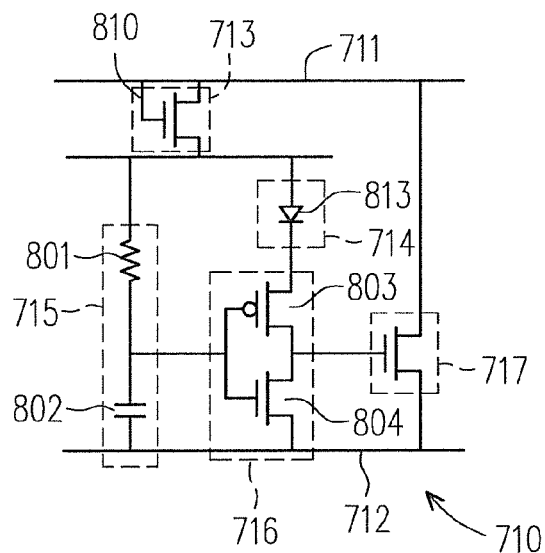
FIG. 8G is a schematic diagram of the ESD clamp circuit according to an embodiment of the present invention.

FIG. 8G is a schematic diagram of the ESD clamp circuit 710 according to an embodiment of the present invention. Referring to the FIG. 8G, the difference between FIG. 8E and FIG. 8G is that the second circuit 714 in the ESD clamp circuit 710 in FIG. 8G is, for example, a diode 813. An anode of the diode 813 serves the first terminal of the second circuit 714. A cathode of the diode 813 serves the second terminal of the second circuit 714. In the present embodiment, an operation method of the ESD clamp circuit 710 is similar to the description of FIG. 8A, the detail is not iterated.

Figure 8H:
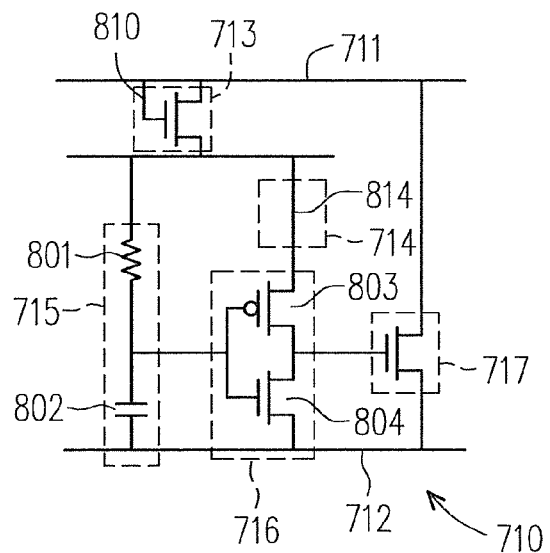
FIG. 8H is a schematic diagram of the ESD clamp circuit according to an embodiment of the present invention.

FIG. 8H is a schematic diagram of the ESD clamp circuit 710 according to an embodiment of the present invention. Referring to the FIG. 8H, the difference between FIG. 8E and FIG. 8H is that the second circuit 714 in the ESD clamp circuit 710 in FIG. 8H is, for example, a conducting wire 814. A first terminal of the conducting wire 814 serves the first terminal of the second circuit 714. A second terminal of the conducting wire 814 serves the second terminal of the second circuit 714. In the present embodiment, an operation method of the ESD clamp circuit 710 is similar to the description of FIG. 8A, the detail is not iterated.

Figure 8I:
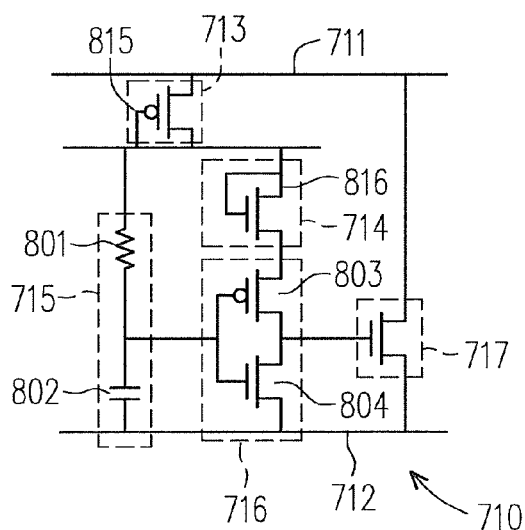
FIG. 8I is a schematic diagram of the ESD clamp circuit according to an embodiment of the present invention.

FIG. 8I is a schematic diagram of the ESD clamp circuit 710 according to an embodiment of the present invention. Referring to the FIG. 8I, the difference between FIG. 8A and FIG. 8I is that the first circuit 713 in the ESD clamp circuit 710 in FIG. 8I is, for example, a P-channel transistor 815, and the second circuit 714 in the ESD clamp circuit 710 in FIG. 8I is, for example, an N-channel transistor 816. A source terminal of the P-channel transistor 815 serves the first terminal of the first circuit 713. A drain terminal of the P-channel transistor 815 serves the second terminal of the first circuit 713. A gate terminal of the P-channel transistor 815 is coupled to the drain terminal of the P-channel transistor 815. A drain terminal of the N-channel transistor 816 serves the first terminal of the second circuit 714. A gate terminal of the N-channel transistor 816 is coupled to the drain terminal of the N-channel transistor 816. A source terminal of the N-channel transistor 816 serves the second terminal of the second circuit 714. In the present embodiment, an operation method of the ESD clamp circuit 710 is similar to the description of FIG. 8A, the detail is not iterated.

Figure 8J:
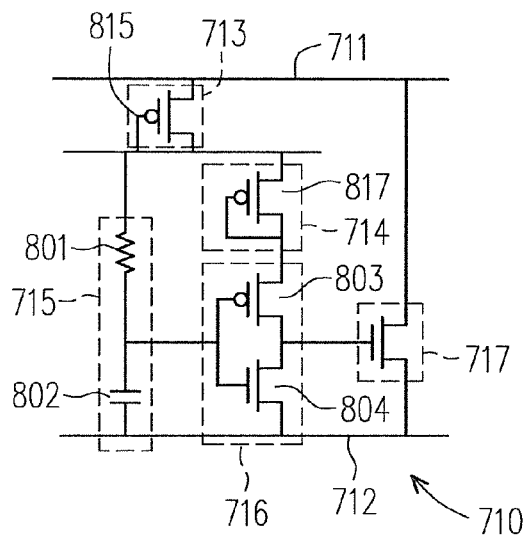
FIG. 8J is a schematic diagram of the ESD clamp circuit according to an embodiment of the present invention.

FIG. 8J is a schematic diagram of the ESD clamp circuit 710 according to an embodiment of the present invention. Referring to the FIG. 8J, the difference between FIG. 8I and FIG. 8J is that the second circuit 714 in the ESD clamp circuit 710 in FIG. 8J is, for example, a P-channel transistor 817. A source terminal of the P-channel transistor 817 serves the first terminal of the second circuit 714. A drain terminal of the P-channel transistor 817 serves the second terminal of the second circuit 714. A gate terminal of the P-channel transistor 817 is coupled to the drain terminal of the P-channel transistor 817. In the present embodiment, an operation method of the ESD clamp circuit 710 is similar to the description of FIG. 8A, the detail is not iterated.

Figure 8K:
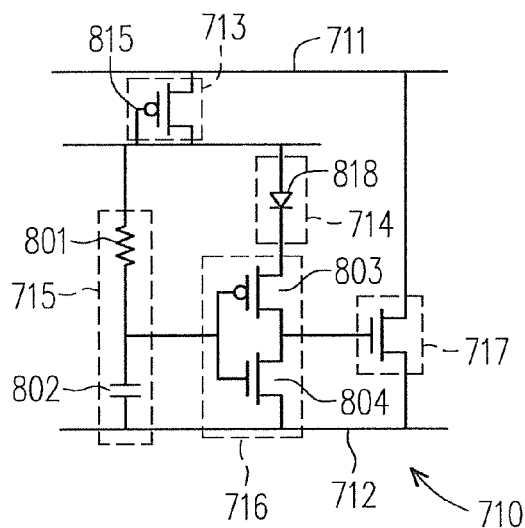
FIG. 8K is a schematic diagram of the ESD clamp circuit according to an embodiment of the present invention.

FIG. 8K is a schematic diagram of the ESD clamp circuit 710 according to an embodiment of the present invention. Referring to the FIG. 8K, the difference between FIG. 8I and FIG. 8K is that the second circuit 714 in the ESD clamp circuit 710 in FIG. 8K is, for example, a diode 818. An anode of the diode 818 serves the first terminal of the second circuit 714. A cathode of the diode 818 serves the second terminal of the second circuit 714. In the present embodiment, an operation method of the ESD clamp circuit 710 is similar to the description of FIG. 8A, the detail is not iterated.

Figure 8L:
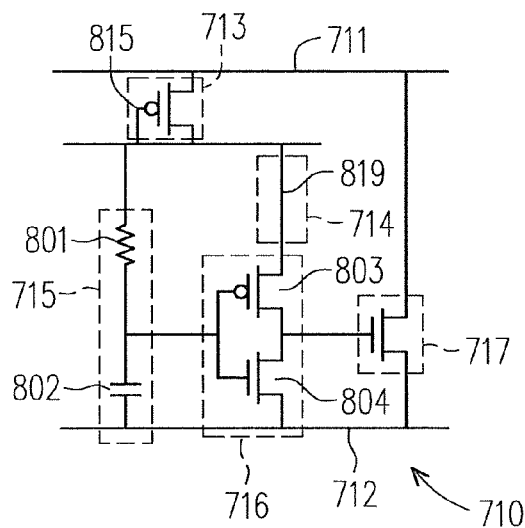
FIG. 8L is a schematic diagram of the ESD clamp circuit according to an embodiment of the present invention.

FIG. 8L is a schematic diagram of the ESD clamp circuit 710 according to an embodiment of the present invention. Referring to the FIG. 8L, the difference between FIG. 8I and FIG. 8L is that the second circuit 714 in the ESD clamp circuit 710 in FIG. 8L is, for example, a conducting wire 819. A first terminal of the conducting wire 819 serves the first terminal of the second circuit 714. A second terminal of the conducting wire 819 serves the second terminal of the second circuit 714. In the present embodiment, an operation method of the ESD clamp circuit 710 is similar to the description of FIG. 8A, the detail is not iterated.

Figure 8M:
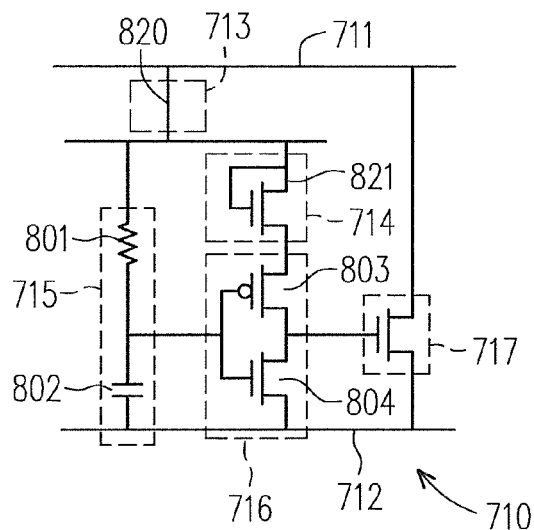
FIG. 8M is a schematic diagram of the ESD clamp circuit according to an embodiment of the present invention.

FIG. 8M is a schematic diagram of the ESD clamp circuit 710 according to an embodiment of the present invention. Referring to the FIG. 8M, the difference between FIG. 8A and FIG. 8M is that the first circuit 713 in the ESD clamp circuit 710 in FIG. 8M is, for example, a conducting wire 820, and the second circuit 714 in the ESD clamp circuit 710 in FIG. 8M is, for example, an N-channel transistor 821. A first terminal of the conducting wire 820 serves the first terminal of the first circuit 713. A second terminal of the conducting wire 820 serves the second terminal of the first circuit 713. A drain terminal of the N-channel transistor 821 serves the first terminal of the second circuit 714. A gate terminal of the N-channel transistor 821 is coupled to the drain terminal of the N-channel transistor 821. A source terminal of the N-channel transistor 821 serves the second terminal of the second circuit 714. In the present embodiment, an operation method of the ESD clamp circuit 710 is similar to the description of FIG. 8A, the detail is not iterated.

Figure 8N:
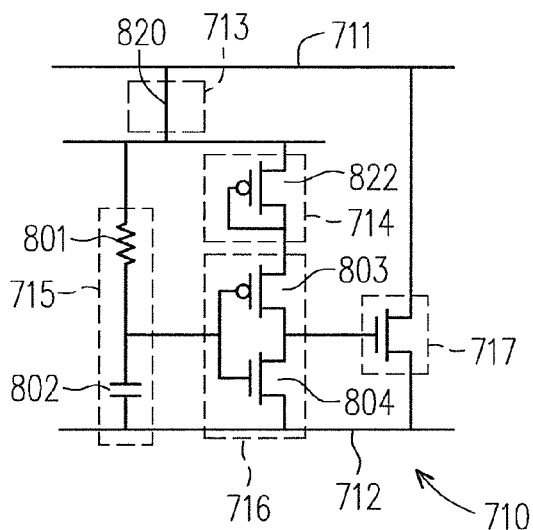
FIG. 8N is a schematic diagram of the ESD clamp circuit according to an embodiment of the present invention.

FIG. 8N is a schematic diagram of the ESD clamp circuit 710 according to an embodiment of the present invention. Referring to the FIG. 8N, the difference between FIG. 8M and FIG. 8N is that the second circuit 714 in the ESD clamp circuit 710 in FIG. 8N is, for example, a P-channel transistor 822. A source terminal of the P-channel transistor 822 serves the first terminal of the second circuit 714. A drain terminal of the P-channel transistor 822 serves the second terminal of the second circuit 714. A gate terminal of the P-channel transistor 822 is coupled to the drain terminal of the P-channel transistor 822. In the present embodiment, an operation method of the ESD clamp circuit 710 is similar to the description of FIG. 8A, the detail is not iterated.

Figure 8O:
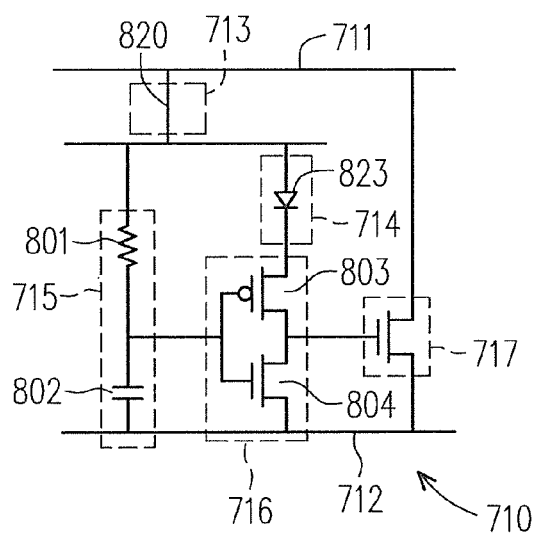
FIG. 8O is a schematic diagram of the ESD clamp circuit according to an embodiment of the present invention.

FIG. 8O is a schematic diagram of the ESD clamp circuit 710 according to an embodiment of the present invention. Referring to the FIG. 8O, the difference between FIG. 8M and FIG. 8O is that the second circuit 714 in the ESD clamp circuit 710 in FIG. 8O is, for example, a diode 823. An anode of the diode 823 serves the first terminal of the second circuit 714. A cathode of the diode 823 serves the second terminal of the second circuit 714. In the present embodiment, an operation method of the ESD clamp circuit 710 is similar to the description of FIG. 8A, the detail is not iterated.

Figure 8P:
FIG. 8P is a schematic diagram of a first circuit or a second circuit of an ESD clamp circuit according to an embodiment of the present invention.

It should be noted, in some embodiments, the first circuit 713 in the FIG. 8A to FIG. 8D and the second circuit 714 in the FIG. 8C, FIG. 8G, FIG. 8K, and FIG. 8O in the above embodiments is only one diode, and the present invention is not limited thereto. For instance, the only one diode may be replaced by a plurality of diodes in series, shown as FIG. 8P. An anode of the diodes in series serves the first terminal of the first circuit 713 or the second circuit 714. A cathode of the diodes in series serves the second terminal of the first circuit 713 or the second circuit 714. The amount of the diodes is determined by those skilled in the art as desired.

Figures 8Q, 8R:
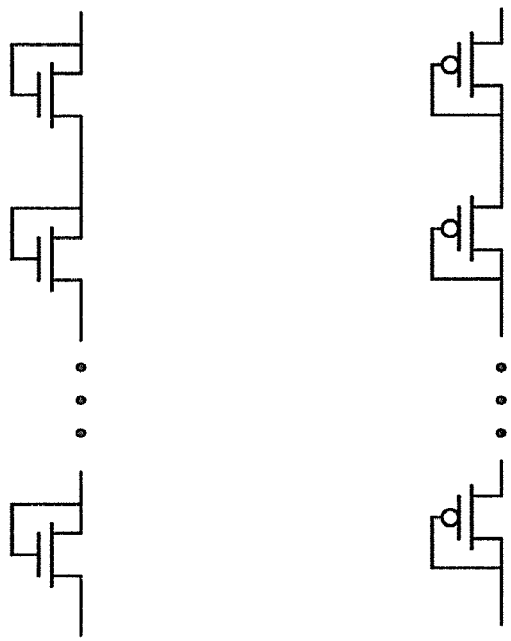
FIG. 8Q is a schematic diagram of a first circuit or a second circuit of an ESD clamp circuit according to an embodiment of the present invention.
FIG. 8R is a schematic diagram of a first circuit or a second circuit of an ESD clamp circuit according to an embodiment of the present invention.

The first circuit 713 in the FIG. 8E to FIG. 8H and the second circuit 714 in the FIG. 8A, FIG. 8E, FIG. 8I, and FIG. 8M in the above embodiments is only one N-channel transistor, and the present invention is not limited thereto. For instance, the only one N-channel transistor may be replaced by M N-channel transistors in series, M is an integer, and M≧1, shown as FIG. 8Q. A drain terminal of first N-channel transistor serves the first terminal of the first circuit 713 or the second circuit 714. A gate terminal of first N-channel transistor is coupled to the drain terminal of first N-channel transistor. A source terminal of $M^{th}$ N-channel transistor serves the second terminal of the first circuit 713 or the second circuit 714. A drain terminal and a gate terminal of $M^{th}$ N-channel transistor are coupled to the source terminal of $M-1^{th}$ N-channel transistor. The amount of the N-channel transistors is determined by those skilled in the art as desired.

The first circuit 713 in the FIG. 8I to FIG. 8L and the second circuit 714 in the FIG. 8B, FIG. 8F, FIG. 8J, and FIG. 8N in the above embodiments is only one P-channel transistor, and the present invention is not limited thereto. For instance, the only one P-channel transistor may be replaced by M P-channel transistors in series, M is an integer, and M≧1, shown as FIG. 8R. A source terminal of first P-channel transistor serves the first terminal of the first circuit 713 or the second circuit 714. A drain terminal of $M^{th}$ P-channel transistor serves the second terminal of the first circuit 713 or the second circuit 714. A gate terminal of $M^{th}$ P-channel transistor is coupled to the drain terminal of $M^{th}$ P-channel transistor. A source terminal of $M^{th}$ P-channel transistor is coupled to a drain terminal and a gate terminal of $M-1^{th}$ P-channel transistor. The amount of the P-channel transistors is determined by those skilled in the art as desired.

Figure 8S:
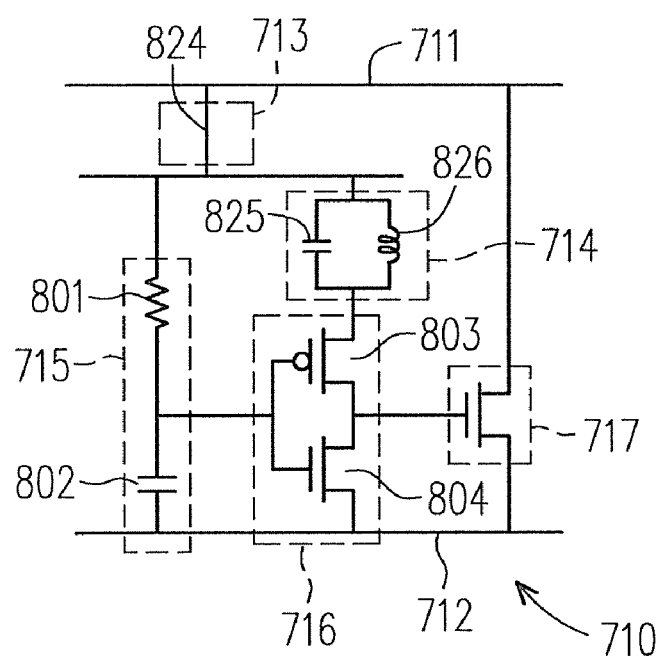
FIG. 8S is a schematic diagram of an ESD clamp circuit according to an embodiment of the present invention.

FIG. 8S is a schematic diagram of the ESD clamp circuit 710 according to an embodiment of the present invention. Referring to the FIG. 8S, the difference between FIG. 8A and FIG. 8S is that the first circuit 713 in the ESD clamp circuit 710 in FIG. 8S is, for example, a conducting wire 824, and the second circuit 714 in the ESD clamp circuit 710 in FIG. 8S includes a capacitor 825 and an inductor 826 in parallel connection. A first terminal of the conducting wire 824 serves the first terminal of the first circuit 713. A second terminal of the conducting wire 824 serves the second terminal of the first circuit 713. A first terminal of the capacitor 825 and the inductor 826 serve as the first terminal of the second circuit 714. A second terminal of the capacitor 825 and the inductor 826 serve as the second terminal of the second circuit 714.

According to a whole operation, because a resonance frequency is formed by the capacitor 825 and inductor 826 so that the second circuit 714 has very high impedance while the ESD clamp circuit 710 operates in high frequency, a voltage at the source terminal of the P-channel transistor may not oscillate in high frequency with large amplitude as the output signal outputted by the power amplifier 730, and may remain to a fixed direct-current voltage level. Besides, a node voltage between the resistor 801 and the capacitor 802 may not oscillate in high frequency as the output signal outputted by the power amplifier 730 because the node voltage is influenced by Resistor-Capacitor (RC) time constant. Therefore, the voltage between the gate terminal and the source terminal of the P-channel transistor 803 is still lower than a threshold voltage of the P-channel transistor 803, and may not oscillate as the amplitude of the output signal outputted by the power amplifier 730. Thereby, a voltage at a gate terminal of an N-channel transistor in the ESD clamp unit 717 is lower than a threshold voltage of the N-channel transistor, so that the N-channel transistor may not be turned on. Then, the problem of signal loss caused by the leakage current can be avoided in the ESD clamp circuit 710.

Figure 8T:
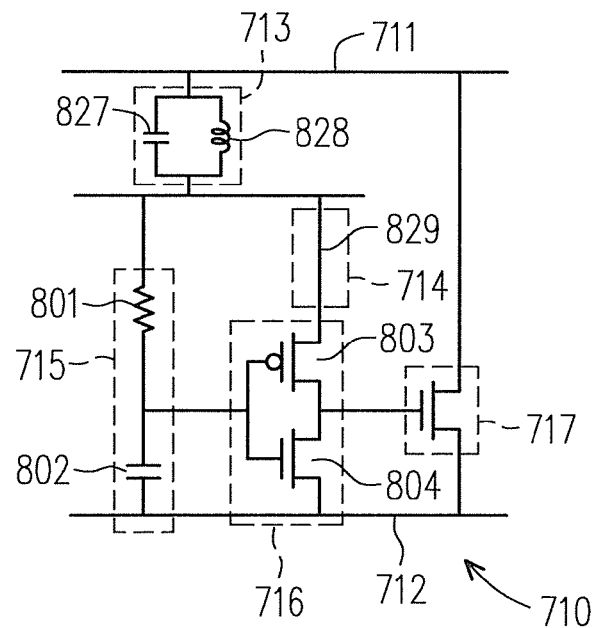
FIG. 8T is a schematic diagram of an ESD clamp circuit according to an embodiment of the present invention.

FIG. 8T is a schematic diagram of the ESD clamp circuit 710 according to an embodiment of the present invention. Referring to the FIG. 8T, the difference between FIG. 8A and FIG. 8T is that the first circuit 713 in the ESD clamp circuit 710 in FIG. 8T includes a capacitor 827 and an inductor 828 in parallel connection, and the second circuit 714 in the ESD clamp circuit 710 in FIG. 8T is, for example, a conducting wire 829. A first terminal of the capacitor 827 and the inductor 828 serve the first terminal of the first circuit 713. A second terminal of the capacitor 827 and the inductor 828 serve the second terminal of the first circuit 713. A first terminal of the conducting wire 829 serves the first terminal of the second circuit 714. A second terminal of the conducting wire 829 serves the second terminal of the second circuit 714. In the present embodiment, an operation method of the ESD clamp circuit 710 is similar to the description of FIG. 8S, the detail is not iterated.

Figure 9:
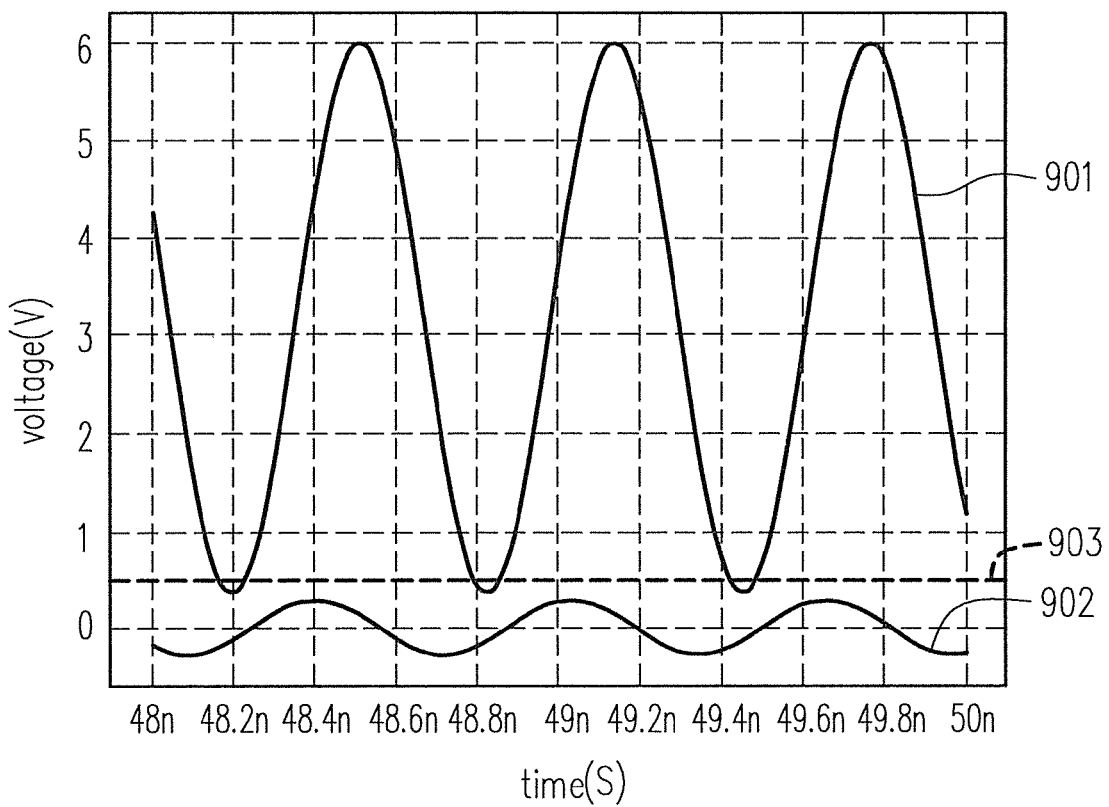
FIG. 9 is a schematic diagram of illustrating a voltage wave of the ESD clamp circuit operating in high frequency of FIG. 8A.

FIG. 9 is a schematic diagram of illustrating a voltage wave of the ESD clamp circuit operating in high frequency of FIG.

8A. Referring to FIG. 9, a curve 901 is an output voltage wave at the output terminal of the power amplifier 730. A curve 902 is a voltage wave at the gate terminal of N-channel transistor the ESD clamp unit 717. A dotted line 903 is the threshold voltage of the N-channel transistor. Referring to the FIG. 9, while the ESD clamp circuit 710 operates in high frequency, the voltage at the gate terminal of the N-channel transistor is lower than the threshold voltage of the N-channel transistor all the time, so that the N-channel transistor may not be turned on, and the ESD clamp circuit 710 may not generate a leakage path. As this result, in the present embodiment, while the ESD clamp circuit 710 operates in high frequency, the output signal of the power amplifier 700 is not distorted by the leakage current.

Figure 10:
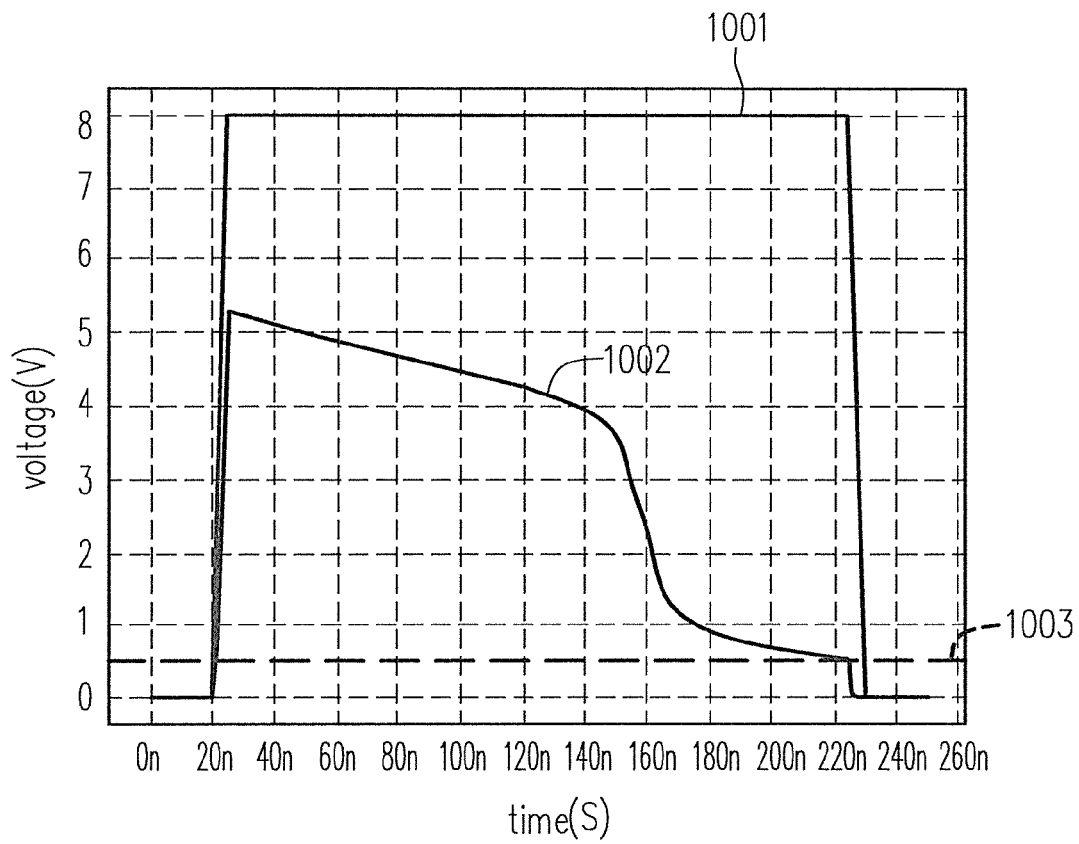
FIG. 10 is a schematic diagram of illustrating a voltage wave of the ESD clamp circuit operating in ESD event of FIG. 8A.

FIG. 10 is a schematic diagram of illustrating a voltage wave of the ESD clamp circuit operating in ESD event of FIG. 8A. Referring to FIG. 10, a curve 1001 is a voltage wave shows that an ESD occurred to the output terminal of the power amplifier 730. A curve 1002 is a voltage wave at the gate terminal of N-channel transistor the ESD clamp unit 717. A dotted line 1003 is the threshold voltage of the N-channel transistor. Referring to the FIG. 10, while the ESD clamp circuit 710 operates in a ESD state, the voltage at the gate terminal of the N-channel transistor is higher than the threshold voltage of the N-channel transistor, so that the N-channel transistor is turned on to form a discharge path, for discharging an ESD current to prevent inner elements damaged.

Figure 2:
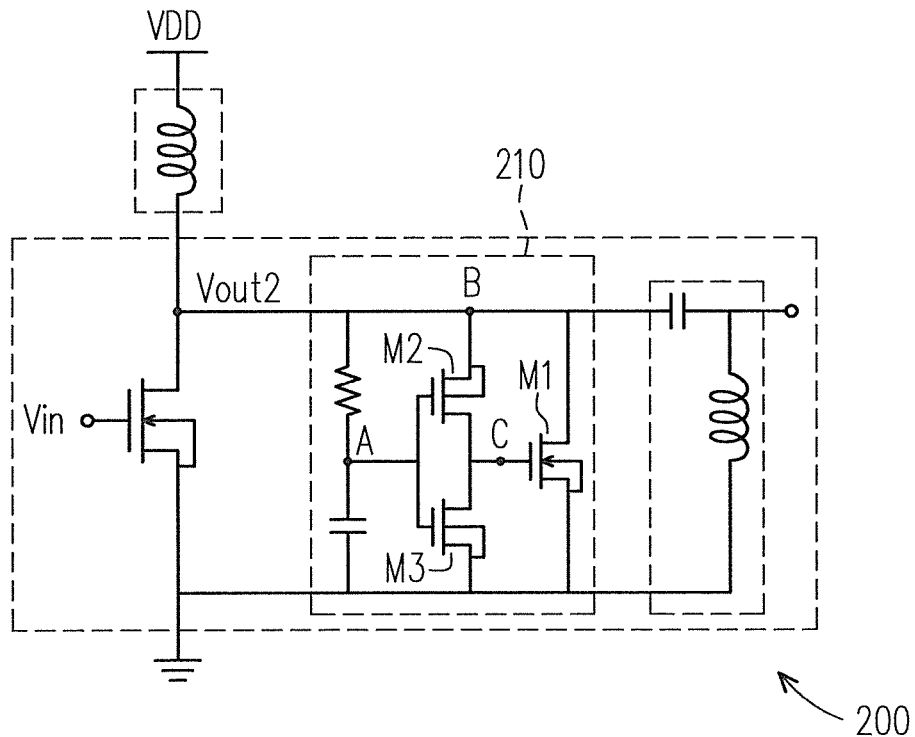
FIG. 2 is a schematic diagram illustrating the power amplifier of FIG. 1 and an additional ESD protection circuit thereof.
Figure 3:
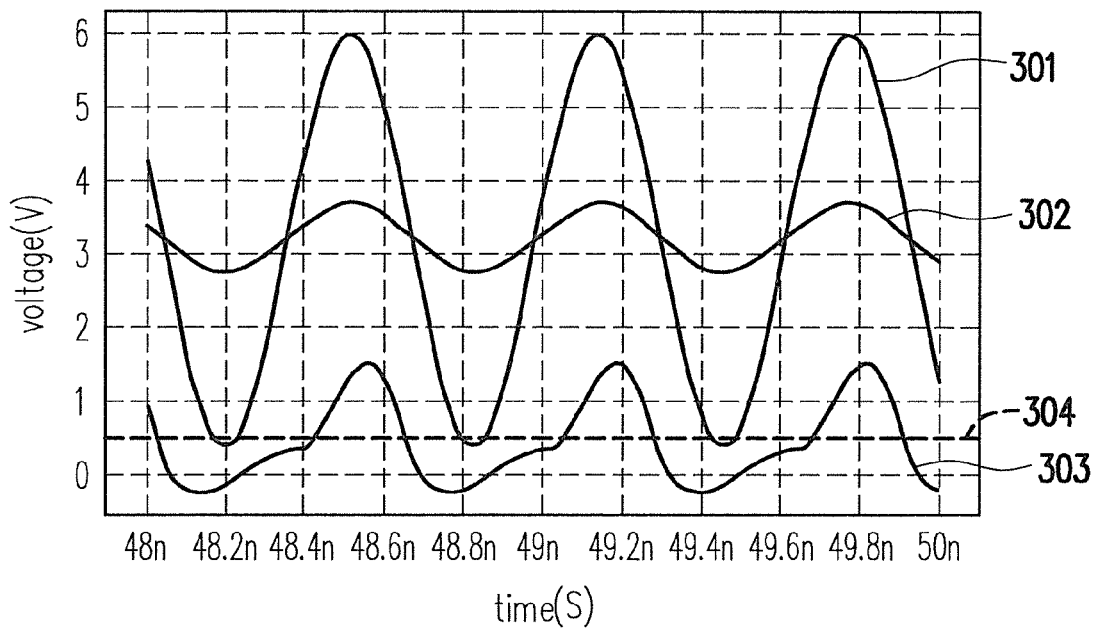
FIG. 3 is a schematic diagram of illustrating a voltage wave of ESD clamp circuit of FIG. 2.
Figure 4:
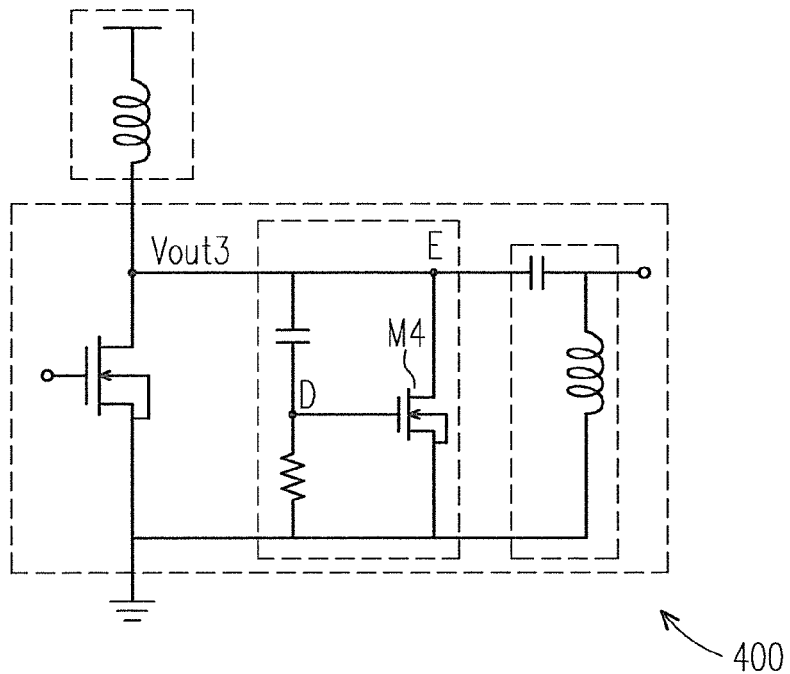
FIG. 4 is another schematic diagram illustrating the power amplifier of FIG. 1 and an additional ESD protection circuit thereof.
Figure 5:
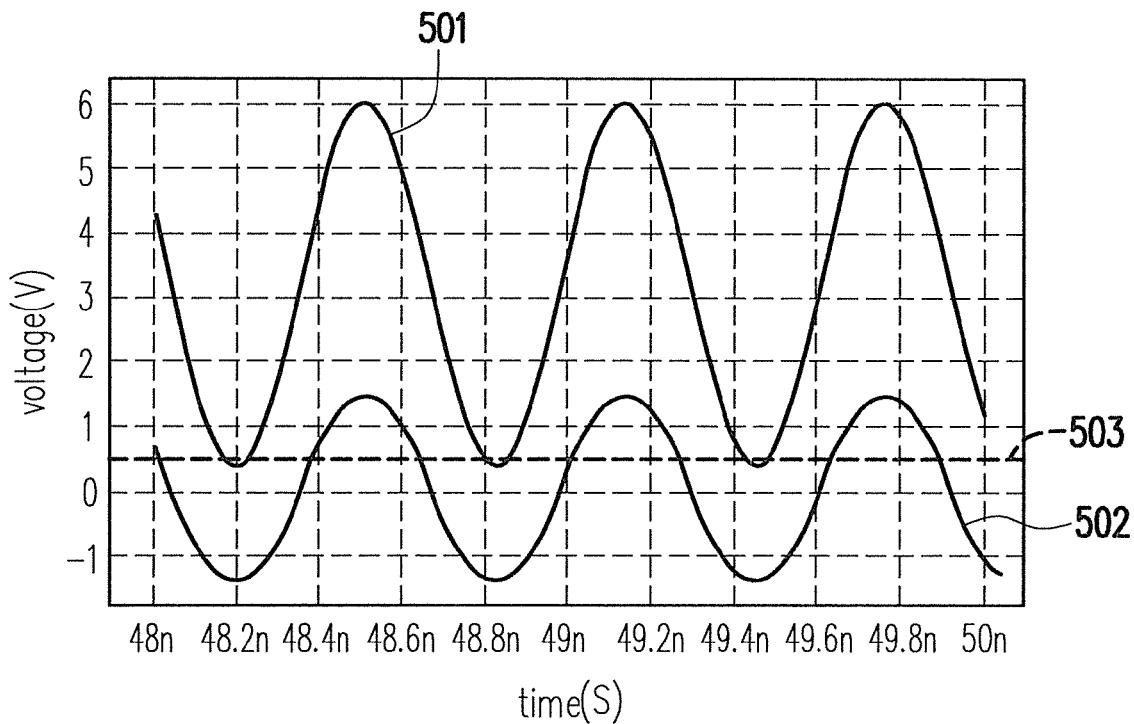
FIG. 5 is a schematic diagram illustrating a voltage wave of ESD clamp circuit of FIG. 4.
Figure 6:
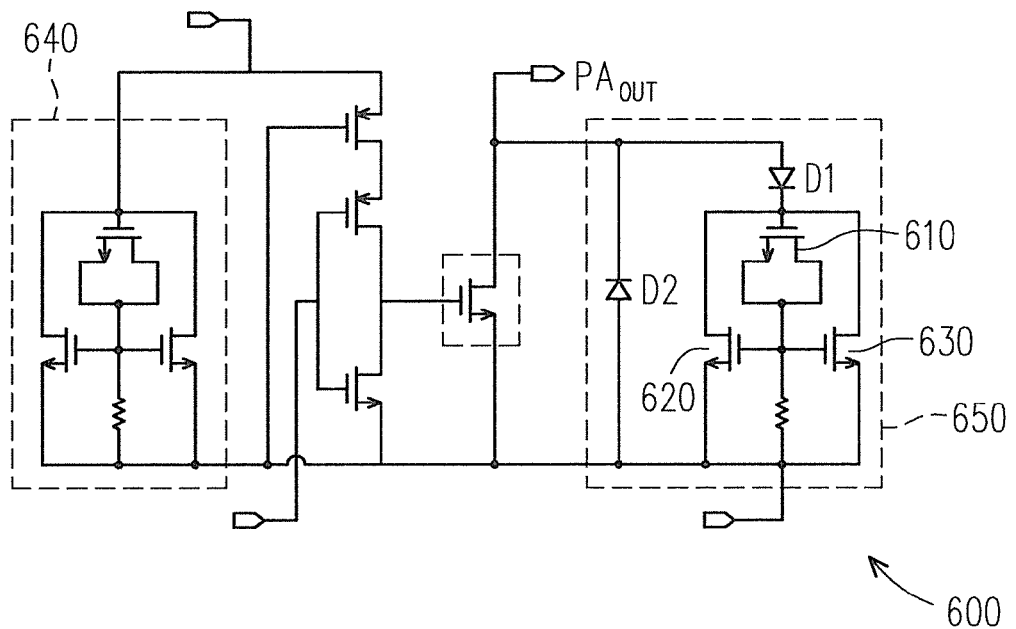
FIG. 6 is a schematic diagram illustrating a radio frequency power amplifier circuit of U.S. Pat. No. 7,280,330.
Figure 11:
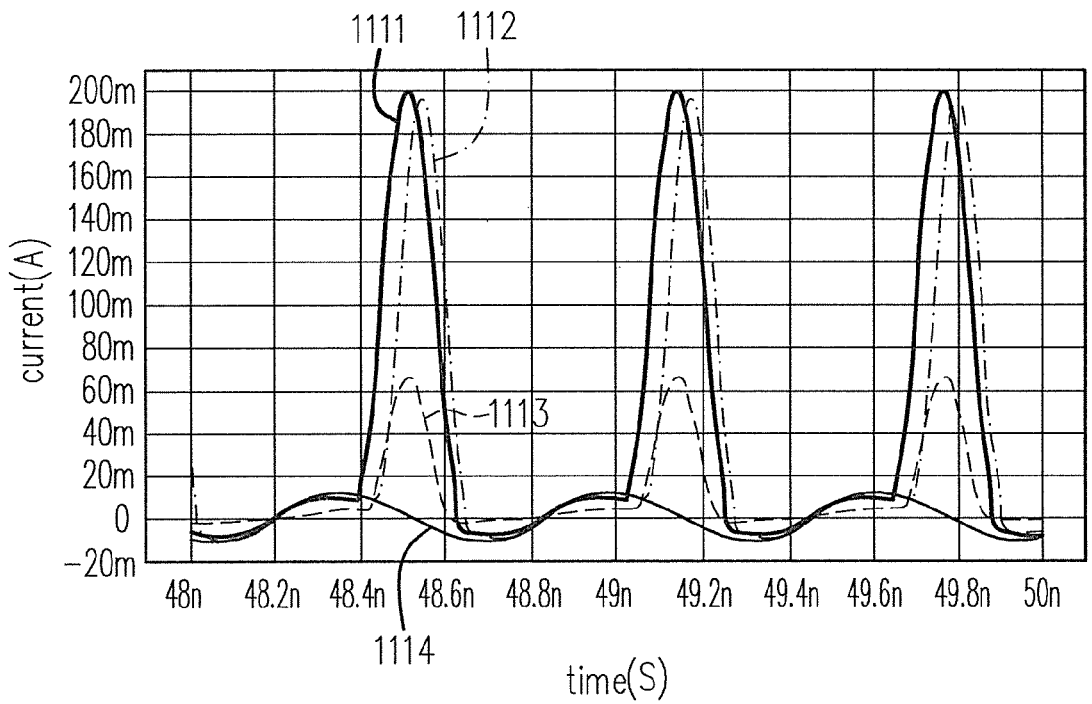
FIG. 11 is a schematic diagram of illustrating conducting currents of the transistors M1, M4, 620, and 630 while the radio frequency power amplifier operates in a normal state of FIG. 2, FIG. 4, and FIG. 6, and a conducting current of the N-channel transistor of the ESD clamp unit 717 while the power amplifier 700 operates in a normal state of FIG. 8A.

FIG. 11 is a schematic diagram of illustrating conducting currents of the transistors M1, M4, 620, and 630 while the radio frequency power amplifier operates in a normal state of FIG. 2, FIG. 4, and FIG. 6, and a conducting current of the N-channel transistor of the ESD clamp unit 717 while the power amplifier 700 operates in a normal state of FIG. 8A. Referring to FIG. 11, a curve 1111 is a conducting current of the transistor M4 of FIG. 4. A curve 1112 is a conducting current of the transistor M1 of FIG. 2. A curve 1113 is a conducting current of the transistor 620 and 630. A curve 1114 is a conducting current of the N-channel transistor of the ESD clamp circuit 710. Referring to the FIG. 11, while the ESD clamp circuit 710 operates in a normal state, the N-channel transistor of the ESD clamp circuit 710 is still turned off, so that the problem of signal loss caused by the leakage current can be avoided.

In overview, according to the present embodiments, a first circuit is added between a first line and an ESD detecting unit, and/or a second circuit is added between the first circuit and a buffer unit. Therefore, a conducting voltage of an ESD clamp unit is controlled effectively, namely a voltage of a gate terminal of N-channel of the ESD clamp unit may be lower than a threshold voltage, so that the problem of signal loss caused by the leakage current of ESD clamp circuit can be avoided in a power amplifier.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A Electrostatic Discharge (ESD) clamp circuit, applied to a power amplifier, comprising:
    a first line, coupled to an output terminal of the power amplifier;
    a second line;
    a first circuit, having a first terminal coupled to the first line, and a second terminal;
    a second circuit, having a first terminal coupled to the second terminal of the first circuit, and a second terminal;
    an ESD detecting unit, having a first detection terminal coupled to the second terminal of the first circuit, and a second detection terminal coupled to the second line, and an output terminal;
    a buffer unit, having a first power terminal coupled to the second terminal of the second circuit, a second power terminal coupled to the second line, an output terminal, and an input terminal coupled to the output terminal of the ESD detecting unit; and
    an ESD clamp unit, having a control terminal coupled to the output terminal of the buffer unit, a first terminal directly connected to the first line, and a second terminal coupled to the second line.

2. The ESD clamp circuit according to claim 1, wherein an operation voltage of the second line is lower than a voltage of the first line.

3. The ESD clamp circuit according to claim 2, wherein the first circuit comprises a diode, having an anode serving as the first terminal of the first circuit, and a cathode serving as the second terminal of the first circuit.

4. The ESD clamp circuit according to claim 3, wherein the second circuit comprises an N-channel transistor, having a drain terminal serving as the first terminal of the second circuit, a gate terminal coupled to the drain terminal, and a source terminal serving as the second terminal of the second circuit.

5. The ESD clamp circuit according to claim 3, wherein the second circuit comprises a P-channel transistor, having a source terminal serving as the first terminal of the second circuit, a drain terminal serving as the second terminal of the second circuit, and a gate terminal coupled to the drain terminal.

6. The ESD clamp circuit according to claim 3, wherein the second circuit comprises a second diode, having an anode serving as the first terminal of the second circuit, and a cathode serving as the second terminal of the second circuit.

7. The ESD clamp circuit according to claim 3, wherein the second circuit comprises a conducting wire, having a first terminal serving as the first terminal of the second circuit, and a second terminal serving as the second terminal of the second circuit.

8. The ESD clamp circuit according to claim 2, wherein the first circuit comprises an N-channel transistor, having a drain terminal serving as the first terminal of the first circuit, a gate terminal coupled to the drain terminal, and a source terminal serving as the second terminal of the first circuit.

9. The ESD clamp circuit according to claim 8, wherein the second circuit comprises a second N-channel transistor, having a drain terminal serving as the first terminal of the second circuit, a gate terminal coupled to the drain terminal, and a source terminal serving as the second terminal of the second circuit.

10. The ESD clamp circuit according to claim 8, wherein the second circuit comprises a P-channel transistor, having a source terminal serving as the first terminal of the second circuit, a drain terminal serving as the second terminal of the second circuit, and a gate terminal coupled to the drain terminal.

11. The ESD clamp circuit according to claim 8, wherein the second circuit comprises a diode, having an anode serving as the first terminal of the second circuit, and a cathode serving as the second terminal of the second circuit.

12. The ESD clamp circuit according to claim 8, wherein the second circuit comprises a conducting wire, having a first terminal serving as the first terminal of the second circuit, and a second terminal serving as the second terminal of the second circuit.

13. The ESD clamp circuit according to claim 2, wherein the first circuit comprises a P-channel transistor, having a source terminal serving as the first terminal of the first circuit, a drain terminal serving as the second terminal of the first circuit, and a gate terminal coupled to the drain terminal.

14. The ESD clamp circuit according to claim 13, wherein the second circuit comprises an N-channel transistor, having a drain terminal serving as the first terminal of the second circuit, a gate terminal coupled to the drain terminal, and a source terminal serving as the second terminal of the second circuit.

15. The ESD clamp circuit according to claim 13, wherein the second circuit comprises a second P-channel transistor, having a source terminal serving as the first terminal of the second circuit, a drain terminal serving as the second terminal of the second circuit, and a gate terminal coupled to the drain terminal.

16. The ESD clamp circuit according to claim 13, wherein the second circuit comprises a diode, having an anode serving as the first terminal of the second circuit, and a cathode serving as the second terminal of the second circuit.

17. The ESD clamp circuit according to claim 13, wherein the second circuit comprises a conducting wire, having a first terminal serving as the first terminal of the second circuit, and a second terminal serving as the second terminal of the second circuit.

18. The ESD clamp circuit according to claim 2, wherein the first circuit comprises a conducting wire, having a first terminal serving as the first terminal of the first circuit, and a second terminal serving as the second terminal of the first circuit.

19. The ESD clamp circuit according to claim 18, wherein the second circuit comprises an N-channel transistor, having a drain terminal serving as the first terminal of the second circuit, a gate terminal coupled to the drain terminal, and a source terminal serving as the second terminal of the second circuit.

20. The ESD clamp circuit according to claim 18, wherein the second circuit comprises a P-channel transistor, having a source terminal serving as the first terminal of the second circuit, a drain terminal serving as the second terminal of the second circuit, and a gate terminal coupled to the drain terminal.

21. The ESD clamp circuit according to claim 18, wherein the second circuit comprises a diode, having an anode serving as the first terminal of the second circuit, and a cathode serving as the second terminal of the second circuit.

22. The ESD clamp circuit according to claim 2, wherein the first circuit comprises a conducting wire, having a first terminal serving as the first terminal of the first circuit, and a second terminal serving as the second terminal of the first circuit, and the second circuit comprises:
    an inductor, having a first terminal serving as the first terminal of the second circuit, and a second terminal serving as the second terminal of the second circuit; and
    a capacitor, having a first terminal coupled to the first terminal of the inductor, and a second terminal coupled to the second terminal of the inductor.

23. The ESD clamp circuit according to claim 2, wherein the second circuit comprises a conducting wire, having a first terminal serving as the first terminal of the second circuit, and a second terminal serving as the second terminal of the second circuit, and the first circuit comprises:
    an inductor, having a first terminal serving as the first terminal of the first circuit, and a second terminal serving as the second terminal of the first circuit; and
    a capacitor, having a first terminal coupled to the first terminal of the inductor, and a second terminal coupled to the second terminal of the inductor.

24. The ESD clamp circuit according to claim 1, wherein the ESD clamp unit comprises an N-channel transistor.

25. The ESD clamp circuit according to claim 1, wherein the ESD detecting unit, comprises:
    a resistor, having a first terminal serving as the first detection terminal of the ESD detecting unit, and a second terminal serving as the output terminal of the ESD detecting unit; and
    a capacitor, having a first terminal coupled to the second terminal of the resistor, and a second terminal serving as the second detection terminal of the ESD detecting unit.

26. The ESD clamp circuit according to claim 1, wherein the buffer unit, comprises:
    a P-channel transistor, having a gate terminal serving as the input terminal of the buffer unit, a source terminal serving as the first power terminal of the buffer unit, and a drain terminal serving as the output terminal of the buffer unit; and
    an N-channel transistor, having a gate terminal coupled to the gate terminal of the P-channel transistor, a source terminal serving as the second power terminal of the buffer unit, and a drain terminal coupled to the drain terminal of the P-channel transistor.

27. The ESD clamp circuit according to claim 2, wherein the first circuit comprises a plurality of diodes in series, having an anode of the diodes in series serving as the first terminal of the first circuit, and a cathode of the diodes in series serving as the second terminal of the first circuit.

28. The ESD clamp circuit according to claim 2, wherein the first circuit comprises M N-channel transistors in series, having a drain terminal and a gate terminal of first N-channel transistor serving as the first terminal of the first circuit, a source terminal of $M^{th}$ N-channel transistor serving as the second terminal of the first circuit, a drain terminal and a gate terminal of $M^{th}$ N-channel transistor coupled to the source terminal of $M-1^{th}$ N-channel transistor, wherein M is an integer greater than 1.

29. The ESD clamp circuit according to claim 2, wherein the first circuit comprises M P-channel transistors in series, having a source terminal of first P-channel transistor serving as the first terminal of the first circuit, a drain terminal and a gate terminal of $M^{th}$ P-channel transistor serving as the second terminal of the first circuit, a source terminal of $M^{th}$ P-channel transistor coupled to a drain terminal and a gate terminal of $M-1^{th}$ P-channel transistor, wherein M is an integer greater than 1.

30. The ESD clamp circuit according to claim 2, wherein the second circuit comprises a plurality of diodes in series, having an anode of the diodes in series serving as the first terminal of the second circuit, and a cathode of the diodes in series serving as the second terminal of the second circuit.

31. The ESD clamp circuit according to claim 2, wherein the second circuit comprises M N-channel transistors in series, having a drain terminal and a gate terminal of first N-channel transistor serving as the first terminal of the second circuit, a source terminal of $M^{th}$ N-channel transistor serving as the second terminal of the second circuit, a drain terminal and a gate terminal of $M^{th}$ N-channel transistor coupled to the source terminal of $M-1^{th}$ N-channel transistor, wherein M is an integer greater than 1.

32. The ESD clamp circuit according to claim 2, wherein the second circuit comprises M P-channel transistors in series, having a source terminal of first P-channel transistor serving as the first terminal of the second circuit, a drain terminal and a gate terminal of $M^{th}$ P-channel transistor serving as the second terminal of the second circuit, a source terminal of $M^{th}$ P-channel transistor coupled to a drain terminal and a gate terminal of $M-1^{th}$ P-channel transistor, wherein M is an integer greater than 1.

* * * * *